(12) United States Patent
Lu et al.

(10) Patent No.: US 7,429,800 B2
(45) Date of Patent: *Sep. 30, 2008

(54) MOLDING COMPOSITION AND METHOD, AND MOLDED ARTICLE

(75) Inventors: Qiwei Lu, Schenectady, NY (US); Michael O'Brien, Clifton Park, NY (US); Gerardo Rocha-Galicia, Clifton Park, NY (US); Prameela Susarla, Clifton Park, NY (US)

(73) Assignee: Sabic Innovative Plastics IP B.V. (NL)

( * ) Notice: Subject to any disclaimer, the term of this patent is extended or adjusted under 35 U.S.C. 154(b) by 539 days.

This patent is subject to a terminal disclaimer.

(21) Appl. No.: 11/172,300

(22) Filed: Jun. 30, 2005

(65) Prior Publication Data

US 2007/0004872 A1 Jan. 4, 2007

(51) Int. Cl.
- H01L 23/29 (2006.01)
- H01L 21/56 (2006.01)
- C08L 63/00 (2006.01)
- C08L 71/00 (2006.01)
- C08L 71/12 (2006.01)
- B32B 27/04 (2006.01)
- B32B 27/18 (2006.01)
- B32B 27/38 (2006.01)

(52) U.S. Cl. .................. 257/793; 257/789; 264/272.11; 428/413; 523/466; 525/523; 525/534

(58) Field of Classification Search ................. 257/787, 257/788, 789, 793; 264/272.11; 428/413; 523/466; 525/523, 529, 534

See application file for complete search history.

(56) References Cited

U.S. PATENT DOCUMENTS

| | | | |
|---|---|---|---|
| 3,375,228 A | 3/1968 | Holoch | |
| 3,496,236 A | 2/1970 | Glenn et al. | |
| 3,763,088 A | 10/1973 | Izawa et al. | |
| 3,923,738 A * | 12/1975 | Van Sorge | 528/496 |
| 4,140,675 A | 2/1979 | White | |
| 4,165,422 A | 8/1979 | White | |
| 4,234,706 A | 11/1980 | White | |
| 4,521,584 A | 6/1985 | Heitz et al. | |
| 4,562,243 A | 12/1985 | Percec | |
| 4,593,052 A | 6/1986 | Irving | |
| 4,623,558 A | 11/1986 | Lin | |
| 4,634,742 A | 1/1987 | Percec | |
| 4,663,402 A | 5/1987 | Percec et al. | |
| 4,665,137 A | 5/1987 | Percec | |
| 4,677,185 A | 6/1987 | Heitz et al. | |
| 4,701,514 A | 10/1987 | Percec | |
| H521 H | 9/1988 | Fan | |
| 4,806,601 A | 2/1989 | Percec | |
| 4,912,172 A | 3/1990 | Hallgren et al. | |
| 4,920,164 A | 4/1990 | Sasaki et al. | |
| 4,923,932 A | 5/1990 | Katayose | |
| 5,001,010 A | 3/1991 | Chao et al. | |
| 5,015,675 A | 5/1991 | Walles et al. | |
| 5,021,543 A | 6/1991 | Mayska et al. | |
| 5,064,882 A | 11/1991 | Walles et al. | |
| 5,071,922 A | 12/1991 | Nelissen | |
| 5,079,268 A | 1/1992 | Nelissen | |
| 5,080,221 A | 1/1992 | Steinkotter | |
| 5,091,480 A | 2/1992 | Percec | |
| 5,162,433 A | 11/1992 | Nishio et al. | |
| 5,213,886 A | 5/1993 | Chao et al. | |
| 5,290,883 A | 3/1994 | Hosokawa et al. | |
| 5,314,984 A | 5/1994 | Markovitz et al. | |
| 5,618,891 A | 4/1997 | Markovitz | |
| 5,834,565 A | 11/1998 | Tracy et al. | |
| 5,872,201 A | 2/1999 | Cheung et al. | |
| 5,965,663 A | 10/1999 | Hayase | |
| 6,051,662 A | 4/2000 | Tracy et al. | |
| 6,054,222 A * | 4/2000 | Takami et al. | 428/417 |
| 6,096,821 A | 8/2000 | Adedeji et al. | |
| 6,197,898 B1 | 3/2001 | van den Berg et al. | |
| 6,307,010 B1 | 10/2001 | Braat et al. | |
| 6,319,969 B1 | 11/2001 | Walther et al. | |
| 6,333,064 B1 | 12/2001 | Gan | |
| 6,352,782 B2 | 3/2002 | Yeager et al. | |
| 6,384,176 B1 | 5/2002 | Braat et al. | |
| 6,387,990 B1 | 5/2002 | Yeager | |
| 6,404,068 B1 | 6/2002 | Tanaka et al. | |

(Continued)

FOREIGN PATENT DOCUMENTS

| | | |
|---|---|---|
| EP | 0 137 545 | 7/1987 |
| EP | 261574 | 11/1991 |
| EP | 0537005 A1 | 4/1993 |
| EP | 1630199 A1 | 3/2006 |
| JP | 10-182940 * | 7/1998 |
| WO | WO 03/072628 | 9/2003 |

OTHER PUBLICATIONS

Machine Translation of JP 10-182940, provided by the JPO website (1998).*
JP1994271837A; Sep. 27, 1994; Machine Translation (12 pages).
JP2002187937A; Jul. 5, 2002; Machine Translation (25 pages).
International Search Report; International Application No. PCT/US2006/023957; International Filing Date Jun. 20, 2006; Date of Mailing Dec. 12, 2006 (6 pages).
Venderbosch et al., "Processing of intractable polymers using reactive solvents: 2. Poly(2,6-dimethyl-1,4-phenylene ether) as a matrix material for high performance composites", Polymer, vol. 36, No. 6, pp. 1167-1178, 1995.
JP1997202850A; Aug. 5, 1997; "Epoxy Resin Composition for Sealing Use, Semiconductor Device Using the Same, and Production of the Composition"; Machine Translation (21 pages).

(Continued)

Primary Examiner—Michael J Feely
(74) Attorney, Agent, or Firm—Cantor Colburn LLP

(57) ABSTRACT

A molding composition suitable for encapsulating solid state devices includes an epoxy resin, a hardener, a poly(arylene ether) resin comprising less than 5 weight percent of particles greater than 100 micrometers, and about 70 to about 95 weight percent of a silica filler, based on the total weight of the composition. After curing, the composition exhibits improved increased copper adhesion and reduced shrinkage compared to conventional molding compositions.

29 Claims, 1 Drawing Sheet

U.S. PATENT DOCUMENTS

| | | | |
|---|---|---|---|
| 6,469,124 | B2 | 10/2002 | Braat et al. |
| 6,518,362 | B1 | 2/2003 | Clough et al. |
| 6,524,702 | B1 | 2/2003 | Betso et al. |
| 6,569,982 | B2 | 5/2003 | Hwang et al. |
| 6,576,700 | B2 | 6/2003 | Patel |
| 6,576,718 | B1 | 6/2003 | Yeager et al. |
| 6,617,398 | B2 | 9/2003 | Yeager et al. |
| 6,617,400 | B2 | 9/2003 | Yeager et al. |
| 6,627,704 | B2 | 9/2003 | Yeager et al. |
| 6,627,708 | B2 | 9/2003 | Braat et al. |
| 6,632,892 | B2 | 10/2003 | Rubinsztajn et al. |
| 6,689,920 | B2 | 2/2004 | Ishii et al. |
| 6,774,160 | B2 | 8/2004 | Yeager |
| 6,777,460 | B2 | 8/2004 | Plazzotto et al. |
| 6,784,260 | B2 | 8/2004 | Yeager et al. |
| 6,787,633 | B2 | 9/2004 | Peemans et al. |
| 6,794,481 | B2 | 9/2004 | Amagai et al. |
| 6,800,373 | B2 | 10/2004 | Gorczyca |
| 6,812,276 | B2 | 11/2004 | Yeager |
| 6,835,785 | B2 | 12/2004 | Ishii |
| 6,878,783 | B2 | 4/2005 | Yeager et al. |
| 6,897,282 | B2 | 5/2005 | Freshour et al. |
| 7,067,595 | B2 | 6/2006 | Zarnoch et al. |
| 7,148,296 | B2 | 12/2006 | Zarnoch et al. |
| 7,235,192 | B2 | 6/2007 | Yeager et al. |
| 7,378,455 | B2 * | 5/2008 | Lu et al. ............ 522/100 |
| 2002/0068530 | A1 | 6/2002 | Li |
| 2002/0077447 | A1 | 6/2002 | Hwang et al. |
| 2003/0018131 | A1 | 1/2003 | Davis et al. |
| 2003/0130438 | A1 | 7/2003 | Amagai et al. |
| 2003/0212230 | A1 | 11/2003 | Rubinsztajn et al. |
| 2003/0215588 | A1 | 11/2003 | Yeager et al. |
| 2004/0054121 | A1 * | 3/2004 | Peemans et al. ............ 528/212 |
| 2004/0146692 | A1 | 7/2004 | Inoue et al. |
| 2004/0147715 | A1 | 7/2004 | Ishii et al. |
| 2004/0152848 | A1 | 8/2004 | Ishii et al. |
| 2004/0166241 | A1 | 8/2004 | Gallo et al. |
| 2004/0214004 | A1 | 10/2004 | Amagai et al. |
| 2004/0258852 | A1 | 12/2004 | Ohno et al. |
| 2004/0265595 | A1 | 12/2004 | Tokiwa |
| 2005/0065241 | A1 | 3/2005 | Ishii et al. |
| 2005/0070685 | A1 | 3/2005 | Mitsui et al. |
| 2005/0075642 | A1 | 4/2005 | Felt et al. |
| 2005/0181214 | A1 | 8/2005 | Campbell et al. |
| 2006/0135705 | A1 | 6/2006 | Vallance et al. |
| 2006/0160982 | A1 | 7/2006 | Ishii et al. |
| 2007/0004819 | A1 * | 1/2007 | Lu et al. ............ 522/170 |
| 2007/0004871 | A1 * | 1/2007 | Lu et al. ............ 525/396 |

OTHER PUBLICATIONS

JP1997202851A; Aug. 5, 1997; "Epoxy Resin Composition for Sealing Use, Semiconductor Device Using the Same, and Production of the Composition"; Machine Translation (23 pages).

JP1998265553A; Oct. 6, 1998; "Epoxy Resin Composition for Sealing Material and Semiconductor Device"; Machine Translation (21 pages).

JP2003313290A; Nov. 6, 2003; "Process for Depositing Low-Molecular Weight Polyphenylene Ether"; Machine Translation (12 pages).

JP2003313291A; Nov. 6, 2003; "Process for Producing Expoxidized Polyphenylene Ether"; Machine Translation (17 pages).

JP2004115619A; Apr. 15, 2004; "Method for Producing Bifunctional Phenylene Ether"; Machine Translation (17 pages).

JP3525745B2; May 10, 2004; "Epoxy Resin Composition and Electric Insulating Substrate Made from the Same"; Machine Translation (15 pages).

JP3570146B2; Sep. 29, 2004; "Epoxy Resin Compositions and Adhesive Sheets and Heat-Resistant Laminates Therefrom"; Machine Translation (17 pages).

JP3570148B2; Sep. 29, 2004; "Epoxy Resin Compositions and Their Uses in Prepregs and Laminates"; Machine Translation (21 pages).

JP2004256717A; Sep. 16, 2004; "Oligomer-Modified Epoxy Resin, Its Composition, and Printed Wiring Board Using the Composition"; Machine Translation (38 pages).

JP2004307554A; Nov. 4, 2004; "Continuous Manufacture of Low-Molecular Weight Poly(Phenylene Ethers)"; Machine Translation (31 pages).

JP2004315725A; Nov. 11, 2004; "Fireproofing Polyphenylene Ether Resin Composition and Prepreg, Metallic Laminate, and Printed Circuit Board Prepared Thereby"; Machine Translation (15 pages).

JP2004331958A; Nov. 25, 2004; "Cured Products of Epoxy Resin Compositions Containing Epoxidized Poly(Phenylene Ethers) for Electronic Materials"; Machine Translation (22 pages).

JP2005023201A; Jan. 27, 2005; "Production Method of Bifunctional Phenylene Ether Oligomer"; Machine Translation (27 pages).

WO2004104097; Dec. 2, 2004; Abstract Only (1 page).

James V. Crivello, "The Synthesis and Cationic Polymerization of Novel Epoxide Monomers", Polymer Engineering and Science (1992), vol. 32, No. 20, pp. 1462-1465.

Prolongo, Silvia G., et al., "Poly(phenylene Ether)/Epoxy Thermoset Blends Based on Anionic Polymerization of Epoxy Monomer"; Journal of Applied Polymer Science; vol. 93, 2678-2687 (2004).

Semi G 69 0996; "Test Method for Measurement of Adhesive Strength Between Leadframes and Molding Compounds"; 14 pages.

ASTM D790-03; "Standard Test Methods for Flexural Properties of Unreinforced and Reinforced Plastics and Electrical Insulating Materials"; 11 pages.

ASTM Designation D 3123-98 (Reapproved 2004); Standard Test Method for Spiral Flow of Low-Pressure Thermosetting Molding Compounds (3 pages).

Semi G66-96 Test Method for the Measurement of Water Absorption Characteristics for Semiconductor Plastic Molding Compounds (3 pages) 1996.

JP10-182940; Jul. 7, 1998; Abstract Only (1 page).

* cited by examiner

MOLDING COMPOSITION AND METHOD, AND MOLDED ARTICLE

BACKGROUND OF THE INVENTION

Solid state electronic devices are typically encapsulated in plastic via transfer molding. Encapsulation protects the device from environmental and mechanical damage and electrically isolates the device. There are many desired technical features of encapsulant compositions. Encapsulation of wire-bonded devices requires low viscosity encapsulant injection, followed by rapid cure and hot ejection. In order to avoid damaging the solid state device, the encapsulant must not shrink excessively on curing. The encapsulated device must subsequently withstand the rigor of solder assembly onto a circuit card. The encapsulant must also be self-extinguishing in the event of a heat-producing malfunction of the circuit. And the encapsulant must adhere strongly to copper leadframes.

Although current epoxy-based encapsulation compositions perform adequately in many applications, there is a desire for compositions that provide improved adhesion to copper, reduced shrinkage, reduced moisture absorption, and reduced coefficients of thermal expansion.

BRIEF DESCRIPTION OF THE INVENTION

The above-described and other drawbacks are alleviated by a curable composition comprising: an epoxy resin; a hardener; a poly(arylene ether) resin comprising less than 5 weight percent of particles greater than 100 micrometers; and about 70 to about 95 weight percent of a silica filler, based on the total weight of the curable composition.

Other embodiments, including a method of preparing the curable composition, a method of encapsulating a solid state device, and an encapsulated solid state device, are described in detail below.

DETAILED DESCRIPTION OF THE INVENTION

Figure 1:
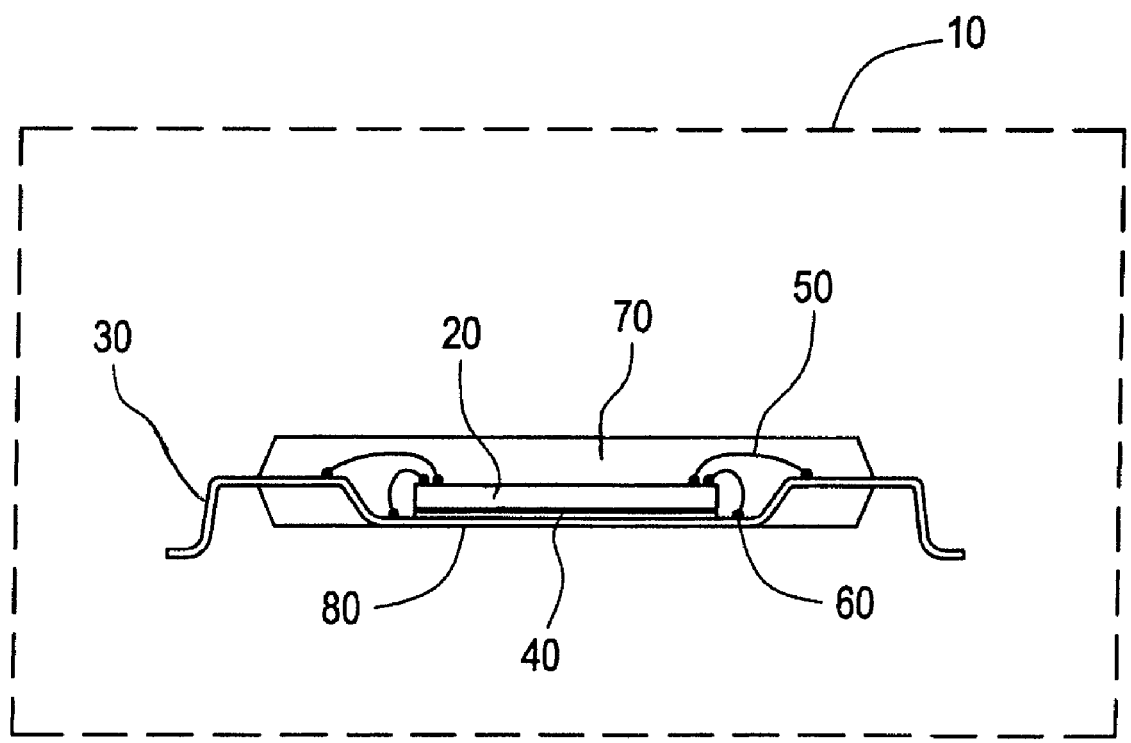
FIG. 1 is a side cross-sectional view of an encapsulated solid state device.

One embodiment is a curable composition, comprising: an epoxy resin; a hardener; a poly(arylene ether) resin comprising less than 5 weight percent of particles greater than 100 micrometers; and about 70 to about 95 weight percent of a silica filler, based on the total weight of the curable composition.

The composition comprises an epoxy resin. In one embodiment the epoxy resin comprises an epoxy resin having a softening point of about 25° C. to about 150° C. Within this range, the melting point may be at least about 30° C or at least about 35° C. Also within this range, the melting point may be up to about 100° C. Softening points may be determined according to ASTM E28-99 (2004). While it is possible to use epoxy resins with softening points below 25° C., the amounts of such resins should be low enough so as not to interfere with the desired friability of the curable composition as a whole.

Suitable epoxy resins include, for example, aliphatic epoxy resins, cycloaliphatic epoxy resins, bisphenol-A epoxy resins, bisphenol-F epoxy resins, phenol novolac epoxy resins, cresol-novolac epoxy resins, biphenyl epoxy resins, polyfunctional epoxy resins, naphthalene epoxy resins, divinylbenzene dioxide, 2-glycidylphenylglycidyl ether, dicyclopentadiene-type epoxy resins, multi aromatic resin type (MAR-type) epoxy resins, and the like, and combinations thereof. In one embodiment, the epoxy resin comprises a monomeric epoxy resin and an oligomer epoxy resin. Monomeric epoxy resins are typically crystalline solids, whereas oligomeric epoxy resins are typically glasses. In one embodiment, the epoxy resin comprises a biphenyl epoxy and an epoxidized cresol novolac.

The curable composition may comprise the epoxy resin in an amount of about 70 to about 98 parts by weight per 100 parts by weight total of the epoxy resin and the poly(arylene ether) resin. Within this range, the epoxy resin amount may be at least about 80 parts by weight or at least about 85 parts by weight. Also within this range, the epoxy resin amount may be up to about 95 parts by weight, or up to about 90 parts by weight.

The curable composition comprises a hardener. Any hardener suitable for use with epoxy resins may be used. Such hardeners include, for example, compounds having two or more functional groups such as amino, acid anhydride, amide, hydroxyl, carboxyl, or mercapto groups. Suitable hardener classes include, for example, novolac type phenol resins obtained by condensation or copolycondensation reaction of phenols (phenol series) such as phenol, cresol, resorcinol, catechol, bisphenol A, bisphenol F, phenylphenol, and aminophenol, and/or naphthols (naphthol series) such as α-naphthol, β-naphthol, and dihydroxynaphthalene, with a compound comprising one or more aldehyde groups such as formaldehyde, benzaldehyde and salicylaldehyde in the presence of acid catalyst; aralkyl type phenol resins such as phenol-aralkyl resins, and naphthol-aralkyl resins, synthesized from phenols and/or naphthols and dimethoxyparaxylene or bis(methoxymethyl)biphenyl; dicyclopentadiene type phenol resins synthesized by copolymerization of phenols and/or naphthols and dicyclopentadiene, such as dicyclopentadiene type phenol novolac resins and dicyclopentadiene type naphthol novolac resins; terpene modified phenol resins; biphenyl type phenol resins; bisphenols, such as bisphenol M (4,4'-(m-phenylenediisopropylidene)diphenol; Chemical Abstracts Registry No. 13595-25-0); triphenylmethane type phenol resins; and the like; and combinations thereof. In one embodiment, the hardener comprises a novolac type phenol resin.

The curable composition may comprise the hardener in an amount effective to cure the epoxy resin. In one embodiment, the hardener may be of about 10 to about 100 parts by weight of hardener per 100 parts by weight total of the epoxy resin and the poly(arylene ether) resin. Within this range, the hardener amount may be at least about 20 parts by weight, or at least about 30 parts by weight. Also within this range, the hardener amount may be up to about 80 parts by weight, or up to about 60 parts by weight. In another embodiment, the hardener amount may be such that the molar ratio of reactive functional groups in the hardener to epoxy groups in the epoxy resin is about 0.8:1 to about 1.2:1.

The curable composition comprises a poly(arylene ether) comprising less than 5 weight percent of particles greater than 100 micrometers. The present inventors have discovered that the curable composition using poly(arylene ether) resin with this particle size unexpectedly increases copper adhesion and flexural strength relative to compositions with larger particle size poly(arylene ether) resins (see working examples, below). In one embodiment, the poly(arylene ether) resin may comprise less than 2 weight percent of particles greater than 100 micrometers, or less than 1 weight percent of particles greater than 100 micrometers. In another embodiment, the poly(arylene ether) resin may exclude particles greater than 80 micrometers, or particles greater than 60 micrometers.

Whether or not a particular poly(arylene ether) resin meets that particle size limitations may be readily determined using particle size determination methods known in the art. For example, if more than 5 weight percent of a poly(arylene ether) resin were retained by a 140 mesh United States standard sieve having an opening size of 105 micrometers, the poly(arylene ether) would not meet the limitation of "comprising less than 5 weight percent of particles greater than 100 micrometers." Poly(arylene ether) resins meeting the desired particle size limitations may be prepared by various methods known in the art. In one embodiment, a poly(arylene ether) resin meeting the particle size limitation may be prepared directly by controlling precipitation conditions as described, for example, in U.S. Pat. No. 6,787,633 B2 to Peemans et al. In another embodiment, a poly(arylene ether) resin meeting the particle size limitation may be prepared by starting with a poly(arylene ether) having greater than 5 weight percent of particles greater than 100 micrometers, reducing the particle size, e.g., by grinding, and separating a poly(arylene ether) resin fraction meeting the particle size limitation, e.g., by sieving the resin with a 170 mesh (88 micrometer opening) sieve.

There is no particular limit on the chemical structure of the poly(arylene ether) resin. In one embodiment, the poly (arylene ether) resin comprises a plurality of repeating units having the structure

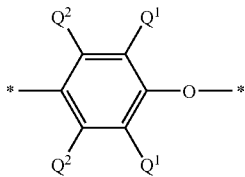

wherein each occurrence of $Q^2$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; and wherein each occurrence of $Q^1$ is independently selected from halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms. Methods of preparing poly(arylene ether) resins are known in the art and include, for example, U.S. Pat. Nos. 3,306,874 and 3,306,875 to Hay.

In one embodiment, the poly(arylene ether) resin has the structure

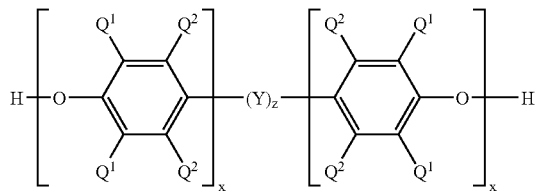

wherein each occurrence of $Q^2$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; and wherein each occurrence of $Q^1$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; each occurrence of x is independently 1 to about 100; z is 0 or 1; and Y has a structure selected from

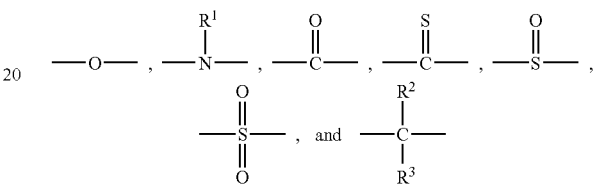

wherein each occurrence of $R^1$, $R^2$, and $R^3$ is independently selected from hydrogen and $C_1$-$C_{12}$ hydrocarbyl. (As used herein, the term "hydrocarbyl", whether used by itself, or as a prefix, suffix, or fragment of another term, refers to a residue that contains only carbon and hydrogen. The residue may be aliphatic or aromatic, straight-chain, cyclic, bicyclic, branched, saturated, or unsaturated. It may also contain combinations of aliphatic, aromatic, straight chain, cyclic, bicyclic, branched, saturated, and unsaturated hydrocarbon moieties.) Methods for producing these poly(arylene ether) resins, sometimes called "dihydroxy" or "difunctional" or "bifunctional" poly(arylene ether) resins are described, for example, in U.S. Pat. Nos. 3,496,236 to Cooper et al., U.S. Pat. Nos. 4,140,675 and 4,165,422 and 4,234,706 to White, U.S. Pat. Nos. 4,521,584 and 4,677,185 to Heitz et al., U.S. Pat. Nos. 4,562,243 and 4,663,402 and 4,665,137 to Percec, U.S. Pat. No. 5,021,543 to Mayska et al., U.S. Pat. No. 5,880,221 to Liska et al., U.S. Pat. No. 5,965,663 to Hayase, U.S. Pat. No. 6,307,010 B1 to Braat et al., U.S. Pat. No. 6,569,982 to Hwang et al., and U.S. Pat. No. 6,794,481 to Amagai et al.

In one embodiment, the poly(arylene ether) resin comprises at least one terminal functional group selected from carboxylic acid, glycidyl ether, and anhydride. A method for preparing a poly(arylene ether) resin substituted with terminal carboxylic acid groups is provided in the working examples, below. Other suitable methods include those described in, for example, European Patent No. 261,574 B1 to Peters et al. Glycidyl ether-functionalized poly(arylene ether) resins and methods for their preparation are described, for example, in U.S. Pat. Nos. 6,794,481 to Amagai et al. and U.S. Pat. No. 6,835,785 to Ishii et al., and U.S. Patent Application Publication No. 2004/0265595 A1 to Tokiwa. Anhydride-functionalized poly(arylene ether) resins and methods for their preparation are described, for example, in European Patent No. 261,574 B1 to Peters et al., and U.S. Patent Application Publication No. 2004/0258852 A1 to Ohno et al.

The intrinsic viscosity of the poly(arylene ether) may vary according to the desired properties of the composition and the other components. In one embodiment, the poly(arylene ether) resin may have an intrinsic viscosity of about 0.03 to 1.0 deciliter per gram measured at 25° C. in chloroform.

Within this range, the intrinsic viscosity may be at least about 0.1 deciliter pre gram, or at least about 0.2 deciliter per gram. Also within this range, the intrinsic viscosity may be up to about 0.6 deciliter per gram, or up to about 0.4 deciliter per gram.

In another embodiment, the poly(arylene ether) resin may have an intrinsic viscosity of about 0.03 to 0.15 deciliter per gram measured at 25° C. in chloroform. Within this range, the intrinsic viscosity may be at least about 0.05 deciliter per gram, or at least about 0.07 deciliter per gram. Also within this range, the intrinsic viscosity may be up to about 0.12 deciliter per gram, or up to about 0.10 deciliter per gram. In another embodiment, the poly(arylene ether) resin may have an intrinsic viscosity of about 0.12 to about 0.30 deciliter per gram measured at 25° C. in chloroform. Methods of preparing low intrinsic viscosity poly(arylene ether) resins include, for example, those described in U.S. Pat. No. 6,307,010 B1 to Braat et al., and U.S. Patent Application Publication No. 2005/0070685 A1 to Mitsui et al.

The curable composition may comprise about 2 to about 30 parts by weight of the poly(arylene ether) resin per 100 parts by weight total of the epoxy resin and the poly(arylene ether) resin. Within this range, the poly(arylene ether) amount may be at least about 5 parts by weight, or at least about 10 parts by weight. Also within this range, the poly(arylene ether) may be up to about 20 parts by weight, or up to about 15 parts by weight.

The curable composition comprises a silica filler. In one embodiment, the silica filler comprises a fused silica. In one embodiment, the silica filler comprises, based on the total weight of silica filler, about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer. Within the above range, the amount of the first fused silica filler may be at least 80 weight percent, or at least 85 weight percent. Also within the above range, the amount of the first fused silica filler may be up to 95 weight percent, or up to 92 weight percent. Within the above range, the amount of the second fused silica filler may be at least about 5 weight percent, or at least about 8 weight percent. Also within the above range, the amount of the second fused silica filler may be up to about 20 weight percent, or up to about 15 weight percent.

The curable composition may, optionally, further comprise a cure accelerator. Suitable cure accelerators include, for example, imidazole compounds, tertiary amines (including 1,8-diazabicyclo(5.4.0)undecene-7 (DBU)), phosphines (including triarylphosphines), phosphine oxides, diphosphines, phosphonium salts, phenol complexes of the foregoing, and the like, and combinations thereof. Phenol complexes of cure accelerators, which are sometimes called latent cure accelerators, include, for example, the 1:1 complex of 1,8-diazabicyclo[5.4.0]undec-7-ene (DBU) and phenol. Suitable imidazole compounds include those having the structure

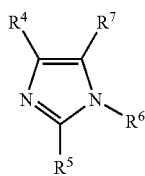

wherein $R^4$-$R^7$ are each independently hydrogen or $C_1$-$C_{12}$ hydrocarbyl. In one embodiment, the cure accelerator comprises triphenylphosphine. When present, the cure accelerate may be used in an amount effective to achieve the desired curing profile, which is typically about 0.2 to about 20 parts by weight per 100 parts by weight epoxy resin.

The curable composition may, optionally, comprise a flame retardant. Although antimony oxide and halogenated aromatic flame retardants may be used, they are preferably avoided. Other suitable flame retardants include, for example, ammonium polyphosphate, melamine phosphate, melamine polyphosphate, melamine cyanurate, resorcinol bis(diphenyl phosphate), piperazine-N,N'-bis(di-(2,6-dimethylphenyl) phosphoramidate), and the like, and combinations thereof. When present, the flame retardant may be used in an amount effective to produce a UL-94 value of V–0 at a thickness of 3.2 millimeters (⅛ inch), which is typically about 5 to about 50 parts by weight per 100 parts by weight total of the epoxy resin and the poly(arylene ether) resin.

The curable composition may, optionally, further comprise one or more additives known in the art. Such additives include, for example, silane coupling agents, mold release agents, colorants (including pigments and dyes), thermal stabilizers, adhesion promoters, ion scavengers, low stress additives, and the like, and combinations thereof. Those skilled in the art can select suitable additives and amounts.

As the composition is defined as comprising multiple components, it will be understood that each component is chemically distinct, particularly in the instance that a single chemical compound may satisfy the definition of more than one component.

After curing, the composition exhibits desirable properties, including improved adhesion to copper, reduced shrinkage, reduced moisture absorption, and reduced coefficients of thermal expansion, all when compared to compositions lacking a poly(arylene ether) with the specified particle size limitation. For example, the cured composition may exhibit a copper adhesion at 23° C. of about 5.7 to about 6.3 megapascals, measured according to SEMI G69-0996.

One embodiment is a curable composition, comprising: about 70 to about 98 parts by weight of an epoxy resin comprising a monomeric epoxy resin and an oligomeric epoxy resin; an effective amount of a phenolic novolac hardener; about 2 to about 30 parts by weight of a poly(arylene ether) resin having an intrinsic viscosity of about 0.05 to about 0.30 deciliters per gram and comprising less than 5 weight percent of particles greater than 100 micrometers; and about 70 to about 95 weight percent of a fused silica filler, based on the total weight of the curable composition; wherein the fused silica filler comprises, based on the total weight of fused silica filler, about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer; wherein all parts by weight are based on 100 parts by weight total of the epoxy resin and the poly(arylene ether) resin.

Another embodiment is a curable composition, comprising: about 70 to about 98 parts by weight of an epoxy resin comprising a biphenyl epoxy resin and an epoxy cresol novolac resin; about 10 to about 100 parts by weight of a phenolic novolac hardener; about 0.2 to about 10 parts by weight of triphenylphosphine; about 2 to about 30 parts by weight of a poly(arylene ether) resin having an intrinsic viscosity of about 0.05 to about 0.30 deciliters per gram and comprising less than 5 weight percent of particles greater than 100 micrometers; and about 70 to about 95 weight percent of a fused silica filler, based on the total weight of the curable composition; wherein the fused silica filer comprises, based on the total weight of fused silica filler, about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer; wherein all parts by weight are based on 100 parts by weight total of the epoxy resin and the poly(arylene ether) resin.

The invention includes methods of encapsulating a solid state device with the curable composition. Thus, one embodiment is a method of encapsulating a solid state device, comprising: encapsulating a solid state device with a curable composition comprising an epoxy resin, a hardener, a poly (arylene ether) resin comprising less than 5 weight percent of particles greater than 100 micrometers, and about 70 to about 95 weight percent of a silica filler, based on the total weight of the curable composition; and curing the curable composition. Curing the composition may, optionally, include post-curing the encapsulated devices (e.g., at about 150 to about 190° C. for about 0.5 to about 8 hours in a convection oven). Suitable methods for encapsulating solid state devices are known in the art and described, for example, in U.S. Pat. Nos 5,064,882 to Walles, U.S. Pat. No. 6,632,892 B2 to Rubinsztajn et al., U.S. Pat. No. 6,800,373 B2 to Gorczyca, U.S. Pat. No. 6,878, 783 to Yeager et al.; U.S. Patent Application Publication No. 2004/0166241 A1 to Gallo et al.; and International Patent Application No. WO 03/072628 A1 to Ikezawa et al.

The invention includes encapsulated devices prepared using the curable composition. Thus, one embodiment is an encapsulated solid state device, comprising: a solid state device; and a cured composition encapsulating the solid state device, wherein the cured composition comprises the products obtained on curing a curable composition comprising an epoxy resin, a hardener, a poly(arylene ether) resin comprising less than 5 weight percent of particles greater than 100 micrometers, and about 70 to about 95 weight percent of a silica filler based on the total weight of the curable composition. Such encapsulated solid state devices include those in which the resin composition is uncured, partially cured, and fully cured.

FIG. 1 is a side cross-sectional view of an encapsulated solid state device, 10. The solid state device 20 is attached to copper leadframe 30 via adhesive layer 40. The solid state device 10 is also connected to the copper leadframe 30 via gold wires 50 and ground bonds 60. Cured molding compound 70 encapsulates the solid state device 20, any exposed edges of the adhesive layer 40, gold wires 50, ground bonds 60, and a portion of the copper lead frame 30, leaving exposed the pad 80, corresponding to a surface of the copper leadframe 30 beneath the solid state device 20.

The invention is further illustrated by the following non-limiting examples.

EXAMPLES 1-5

Five compositions varying in poly(arylene ether) type and amount were prepared and tested. Compositions are detailed in Table 1. Example 1 contained no poly(arylene ether). Examples 2 and 4 contained poly(2,6-dimethyl-1,4-phenylene ether) resins having intrinsic viscosities of 0.12 and 0.30 deciliters/gram, respectively, both having been sieved to contain only particles smaller than 44 micrometers. Examples 3 and 5 contained poly(2,6-dimethyl-1,4-phenylene ether) resins having intrinsic viscosities of 0.12 and 0.30 deciliters/gram, respectively, both having been sieved to contain only particles larger than 149 micrometers. All samples contained silica resin, epoxy silane coupling agent, biphenyl epoxy resin, epoxy cresol novolac resin, phenolic novolac resin, triphenylphosphine, carnauba wax, carbon black, antimony oxide, and tetrabromo bisphenol A. "Denka FB570 silica" is a fused silica obtained from Denka having a median particle size of 17.7 micrometers and a surface area of 3.1 meter$^2$/gram. "Denka SFP silica" is a fused silica obtained from Denka having a median particle size of 0.7 micrometers and a surface area of 6.2 meter$^2$/gram. The epoxy silane coupling agent, glycidoxypropyl trimethoxy silane (Chemical Abstracts Registry No. 2530-83-8) was obtained as Z6040 from Dow Corning. The biphenyl epoxy resin 3,3',5,5'-tetramethyl-4,4'-diglycidyloxy biphenyl was obtained as RSS1407LC from Yuka Shell. An epoxy cresol novolac resin was obtained as CNE195XL-4 from Chang Chung. A phenolic novolac hardener was obtained as Tamanol 758 from Arakawa. Triphenylphosphine was obtained from Aldrich Chemical. The poly(2,6-dimethyl-1,4-phenylene ether) resins were obtained from GE Advanced Materials. A micronized carnauba wax was obtained as MICHEM® Wax 411 from Michelman. Carbon black pigment was obtained as BLACK PEARLS® 120 from Cabot. Tetrabromo bisphenol A (Chemical Abstracts Registry No. 79-94-7) was obtained as BA59P from Great Lakes.

Curable compositions were prepared by mixing all ingredients in a Henschel mixer, then extruding the mixture in a co-rotating twin-screw extruder set at 60° C. in the rear section and 90° C. in the front. After cooling and hardening, the materials were then ground to a powder using a Retsch mill.

Spiral flow lengths, expressed in centimeters (cm), were determined according to ASTM standard D3123-98 (also SEMI G11-88), using the standard spiral flow mold specified therein. A 20-gram charge of the molding compound was transferred into the spiral cavity of the tool, and the length traveled by the compound before flow stopped due to cure/pressure drop, was measured. The injection speed and injection pressure were kept constant across all formulations at 5.84 centimeters/second and 6.9 megapascals (MPa), respectively. Mold temperature was maintained at 175° C.

Specimens for flexural strength, thermomechanical analysis (TMA), and moisture absorption measurements were prepared by transfer molding as follows. A 15-ton resin transfer press (Fujiwa) was used. A four-cavity "Izod" specimen mold was used to transfer-mold a 35-gram charge of curable composition under an injection pressure of 6.9 MPa, at a ram speed of 2.54 millimeters/sec. The mold was maintained at 175° C., and a two-minute cure cycle was used. Specimens were post-cured in a forced-air convection oven for six hours at 175° C.

Thermomechanical analysis was used to determine the coefficient of thermal expansion (CTE) and the glass transition ($T_g$) of the molded EMC. Thermomechanical analysis was performed on a Perkin Elmer TMA 7 Instrument. Transfer-molded specimens measuring at least 3 millimeters (mm) in each dimension were used. The sample temperature was first ramped at 5° C./min from 25° C. to 250° C. then cooled at 5° C./min to 0° C. The second heat, used for analysis, ramped from 0° C. at 5° C./min to 250° C. An initial vertical probe force of 0.05 Newton was used. Glass transition temperature, $T_g$, was taken as the point of intersection of two tangents drawn to the dimension-temperature curve, at 50° C. and 190° C. The measurements were made under a nitrogen atmosphere at 100 milliliters/minute. CTE values are expressed in units of parts per million per degree centigrade (ppm/° C.). "CTE1" refers to the coefficient of thermal expansion below $T_g$, and "CTE2" refers to the coefficient of thermal expansion above $T_g$.

Moisture absorption was measured according to SEMI G66-96 standard test method (saturated area), with the exception of the sample dimensions and drying schedule. Four transfer-molded specimens (6.35×1.25×0.3 cm in size, standard "Izod" dimensions) were used. The dry weight of each specimen was noted after oven drying for one hour at 110° C. The samples were then conditioned in a humidity controlled chamber at 85° C. and 85% relative humidity for 168 hours. Moist weights were measured within about 10 minutes of removing the samples from the conditioning chamber, holding the specimens in a closed, humid container in the interim.

Adhesion to copper substrate was measured according to SEMI G69-0996, "Test Method for measurement of adhesive strength between leadframes and molding compounds." The "pull" method was used, with a 5-mil thick copper substrate transfer-molded into a block of molding compound, 2.8 millimeter thick. (The leadframe and tool recommended by the SEMI standard were not used—however, the test specimen geometry is similar to the recommended standard.) The copper substrate used was EFTEC 64T ½ H grade from Furukawa Metals. The adhesive area (the triangular portion of the copper that was molded into the molding compound) was about 15.2 millimeter$^2$, including both sides. The adhesion of the mold compound to copper was tested by pulling the copper "tab" out of the mold compound using an Instron tensile tester, at the rate of 2 millimeter/min. The peak load was recorded as the adhesive strength. The peak load was measured in pounds, divided by the area (15.2 mm$^2$), and converted to megapascals (MPa) for reporting.

To determine flexural strength, the samples (6.35 cm×1.27 cm×0.3175 cm) were tested at room temperature according to ASTM D790 for three-point bend flexural test.

Shrinkage was measured as follows. The curable composition was transfer molded into rectangular Izod-type specimens (6.35 centimeter×1.27 centimeter×0.3175 centimeter; 2.5 inch×0.5 inch×⅛ inch) using a four-cavity tool on a 15-ton Fujiwa transfer press. The specimens were then demolded and allowed to cool down to room temperature. The dimensions of the specimens were measured using a micrometer or calipers with 0.01 millimeter (0.0005 inch) accuracy. Three readings per specimen were taken for width and thickness measurements. Two readings were taken for length measurements, while carefully avoiding the gate break-off area. Typically, sixteen specimens were measured per material, and average "as-molded" shrinkage was reported.

Flammability was determined according to Underwriters Laboratories UL-94 test procedures. A UL-94 rating of V–0 requires a flame-out time of not more than 10 seconds in any trial and a cumulative flame-out time of not more than 50 seconds for five samples.

Property values are summarized in Table 1. The results show that Examples 2 and 4, with small particle size poly (arylene ether) resins, exhibited increased copper adhesion at 23° C. and 240° C., increased glass transition temperatures, and reduced shrinkage relative to Example 1, without any poly(arylene ether) resin. In addition, Example 2, with small particle size poly(arylene ether) resin having an intrinsic viscosity of 0.12 deciliters per gram in chloroform at 25° C., exhibited reduced moisture absorption and reduced coefficients of thermal expansion relative to Example 1.

TABLE 1

|  | Ex. 1 | Ex. 2 | Ex. 3 | Ex. 4 | Ex. 5 |
| --- | --- | --- | --- | --- | --- |
| composition |  |  |  |  |  |
| Denka FB570 silica | 1476.00 | 1476.00 | 1476.00 | 1476.00 | 1476.00 |
| Denka SFP silica | 164.00 | 164.00 | 164.00 | 164.00 | 164.00 |
| epoxy silane, GPTMS Z6040, Dow Corning | 10.93 | 10.93 | 10.93 | 10.93 | 10.93 |
| biphenyl epoxy, RSS1407LC, Yuka Shell | 63.04 | 53.58 | 53.58 | 53.58 | 53.58 |
| epoxy cresol novolac, CNE195XL_4, Chang Chung | 136.79 | 116.27 | 116.27 | 116.27 | 116.27 |
| phenolic novolac, Tamanol 758, Arakawa | 97.45 | 82.83 | 82.83 | 82.83 | 82.83 |
| triphenylphosphine, Aldrich | 4.77 | 4.06 | 4.06 | 4.06 | 4.06 |
| PPE, 0.12 IV, <44 micrometer particles | — | 50.86 | — | — | — |
| PPE, 0.12 IV, >149 micrometer particles | — | — | 50.86 | — | — |
| PPE, 0.30 IV, <44 micrometer particles | — | — | — | 50.86 | — |
| PPE, 0.30 IV, >149 micrometer particles | — | — | — | — | 50.86 |
| carnauba wax, Michem Wax 411, Michelman | 6.00 | 6.00 | 6.00 | 6.00 | 6.00 |
| carbon black, Black Pearls 120, Cabot | 4.00 | 4.00 | 4.00 | 4.00 | 4.00 |
| antimony oxide | 16.04 | 13.63 | 13.63 | 13.63 | 13.63 |
| tetrabromo bisphenol A, BA59P, Great Lakes | 20.97 | 17.82 | 17.82 | 17.82 | 17.82 |
| properties |  |  |  |  |  |
| spiral flow (cm) | 129.5 | 68.8 | 68.3 | 71.9 | 71.6 |
| moisture absorption (%) | 0.245 | 0.239 | 0.240 | 0.260 | 0.257 |
| copper adhesion, 23° C. (MPa) | 5.56 | 6.29 | 5.97 | 5.76 | 5.21 |
| copper adhesion, 240° C. (MPa) | 0.77 | 0.79 | — | 0.93 | — |
| flexural strength (MPa) | 125.6 | 114.9 | 105.9 | 120.1 | 103.4 |
| CTE1 (ppm/° C.) | 12 | 11 | — | 12 | 9.6 |
| CTE2 (ppm/° C.) | 44 | 39 | — | 44 | 41 |
| $T_g$ (° C.) | 139 | 146 | — | 144 | 150 |
| length shrinkage (%) | 0.32 | 0.20 | — | 0.22 | — |
| thickness shrinkage (%) | 1.39 | 1.03 | — | 1.32 | — |
| UL-94 | V-0 | V-0 | V-0 | V-0 | V-0 |

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

All ranges disclosed herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A curable composition, comprising:
an epoxy resin;
a hardener;
a poly(arylene ether) resin comprising less than 5 weight percent of particles greater than 100 micrometers; and
about 70 to about 95 weight percent of a silica filler, based on the total weight of the curable composition.

2. The curable composition of claim 1, wherein the epoxy resin comprises an epoxy resin having a softening point of about 25° C. to about 150° C.

3. The curable composition of claim 1, wherein the epoxy resin is selected from aliphatic epoxy resins, cycloaliphatic epoxy resins, bisphenol-A epoxy resins, bisphenol-F epoxy resins, phenol novolac epoxy resins, cresol-novolac epoxy resins, biphenyl epoxy resins, polyfunctional epoxy resins, naphthalene epoxy resins, divinylbenzene dioxide, 2-glycidylphenylglycidyl ether, dicyclopentadiene-type epoxy resins, multi aromatic resin type epoxy resins, and combinations thereof.

4. The curable composition of claim 1, wherein the epoxy resin comprises a monomeric epoxy resin and an oligomeric epoxy resin.

5. The curable composition of claim 1, wherein the epoxy resin comprises a biphenyl epoxy and an epoxidized cresol novolac.

6. The curable composition of claim 1, comprising about 70 to about 98 parts by weight of the epoxy resin per 100 parts by weight total of the epoxy resin and the poly(arylene ether) resin.

7. The curable composition of claim 1, wherein the hardener is selected from novolac type phenol resins, aralkyl type phenol resins, dicyclopentadiene type phenol resins, terpene modified phenol resins, biphenyl type phenol resins, bisphenols, triphenylmethane type phenol resins, and combinations thereof.

8. The curable composition of claim 1, wherein the hardener comprises a novolac type phenol resin.

9. The curable composition of claim 1, comprising about 10 to about 100 parts by weight of hardener per 100 parts by weight total of the epoxy resin and the poly(arylene ether) resin.

10. The curable composition of claim 1, wherein the poly (arylene ether) resin comprises less than 1 weight percent of particles greater than 100 micrometers.

11. The curable composition of claim 1, wherein the poly (arylene ether) resin comprises less than 1 weight percent of particles greater than 60 micrometers.

12. The curable composition of claim 1, wherein the poly (arylene ether) resin comprises a plurality of repeating units having the structure

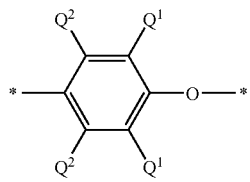

wherein each occurrence of $Q^2$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; and wherein each occurrence of $Q^1$ is independently selected from halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms.

13. The curable composition of claim 1, wherein the poly (arylene ether) resin has the structure

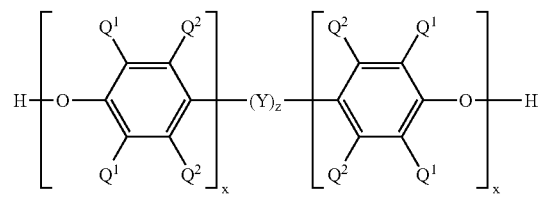

wherein each occurrence of $Q^2$ is independently selected from hydrogen, halogen, primary or secondary $C_1$-$C_{12}$ alkyl, $C_2$-$C_{12}$ alkenyl, C3-$C_{12}$ alkenylalkyl, C2-$C_{12}$ alkynyl, $C_3$-$C_{12}$ alkynylalkyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; and wherein each occurrence of $Q^1$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; each occurrence of x is independently 1 to about 100; z is 0 or 1; and Y has a structure selected from

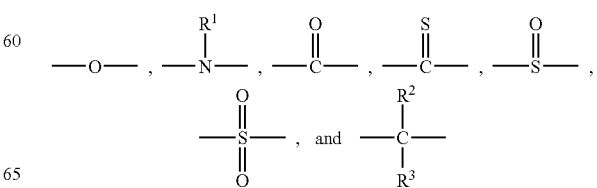

wherein each occurrence of $R^1$, $R^2$, and $R^3$ is independently selected from hydrogen and $C_1$-$C_{12}$ hydrocarbyl.

14. The curable composition of claim 1, wherein the poly(arylene ether) resin comprises at least one terminal functional group selected from carboxylic acid, glycidyl ether, and anhydride.

15. The curable composition of claim 1, wherein the poly(arylene ether) resin has an intrinsic viscosity of about 0.03 to 1.0 deciliters per gram measured at 25° C. in chloroform.

16. The curable composition of claim 1, wherein the poly(arylene ether) resin has an intrinsic viscosity of about 0.03 to 0.15 deciliters per gram measured at 25° C. in chloroform.

17. The curable composition of claim 1, wherein the poly(arylene ether) resin has an intrinsic viscosity of about 0.12 to about 0.30 deciliters per gram measured at 25° C. in chloroform.

18. The curable composition of claim 1, comprising about 2 to about 30 parts by weight of the poly(arylene ether) resin per 100 parts by weight total of the epoxy resin and the poly(arylene ether) resin.

19. The curable composition of claim 1, wherein the silica filler comprises a fused silica.

20. The curable composition of claim 1, wherein the silica filler comprises, based on the total weight of silica filler, about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer.

21. The curable composition of claim 1, further comprising a cure accelerator selected from imidazole compounds, tertiary amines, phosphines, phosphine oxides, diphosphines, phosphonium salts, phenol complexes of the foregoing, and combinations thereof.

22. The curable composition of claim 21, wherein the cure accelerator comprises triphenylphosphine.

23. The curable composition of claim 1, further comprising a flame retardant selected from ammonium polyphosphate, melamine phosphate, melamine polyphosphate, melamine cyanurate, resorcinol bis(diphenyl phosphate), piperazine-N, N'-bis(di-(2,6-dimethylphenyl)phosphoramidate), and combinations thereof.

24. The curable composition of claim 1, further comprising an additive selected from silane coupling agents, mold release agents, colorants, thermal stabilizers, adhesion promoters, ion scavengers, low stress additives, and combinations thereof.

25. The curable composition of claim 1, exhibiting a copper adhesion at 23° C. of about 5.7 to about 6.3 megapascals, measured according to SEMI G69-0996.

26. A curable composition, comprising:
about 70 to about 98 parts by weight of an epoxy resin comprising a monomeric epoxy resin and an oligomeric epoxy resin;
an effective amount of a phenolic novolac hardener;
about 2 to about 30 parts by weight of a poly(arylene ether) resin having an intrinsic viscosity of about 0.05 to about 0.30 deciliters per gram and comprising less than 5 weight percent of particles greater than 100 micrometers; and
about 70 to about 95 weight percent of a fused silica filler, based on the total weight of the curable composition; wherein the fused silica filler comprises, based on the total weight of fused silica filler, about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer;
wherein all parts by weight are based on 100 parts by weight total of the epoxy resin and the poly(arylene ether) resin.

27. A curable composition, comprising:
about 70 to about 98 parts by weight of an epoxy resin comprising a biphenyl epoxy resin and an epoxy cresol novolac resin;
about 10 to about 100 parts by weight of a phenolic novolac hardener;
about 0.2 to about 10 parts by weight of triphenylphosphine;
about 2 to about 30 parts by weight of a poly(arylene ether) resin having an intrinsic viscosity of about 0.05 to about 0.15 deciliters per gram measured at 25° C. in chloroform and comprising less than 1 weight percent of particles greater than 60 micrometers; and
about 70 to about 95 weight percent of a fused silica filler, based on the total weight of the curable composition; wherein the fused silica filler comprises, based on the total weight of fused silica filler, about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer;
wherein all parts by weight are based on 100 parts by weight total of the epoxy resin and the poly(arylene ether) resin.

28. A method of encapsulating a solid state device, comprising:
encapsulating a solid state device with a curable composition comprising
an epoxy resin,
a hardener,
a poly(arylene ether) resin comprising less than 5 weight percent of particles greater than 100 micrometers, and
about 70 to about 95 weight percent of a silica filler, based on the total weight of the curable composition, and
curing the curable composition.

29. An encapsulated solid state device, comprising:
a solid state device; and
a cured composition encapsulating the solid state device; wherein the cured composition comprises the products obtained on curing a curable composition comprising
an epoxy resin,
a hardener,
a poly(arylene ether) resin comprising less than 5 weight percent of particles greater than 100 micrometers, and
about 70 to about 95 weight percent of a silica filler, based on the total weight of the curable composition.

* * * * *